(12) United States Patent
Wada et al.

(10) Patent No.: US 10,180,461 B2
(45) Date of Patent: Jan. 15, 2019

(54) BATTERY INTERNAL STATE ESTIMATION APPARATUS

(71) Applicant: MITSUBISHI ELECTRIC CORPORATION, Chiyoda-ku (JP)

(72) Inventors: Toshihiro Wada, Chiyoda-ku (JP); Keita Hatanaka, Chiyoda-ku (JP); Hidetoshi Kitanaka, Chiyoda-ku (JP); Yuruki Okada, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 264 days.

(21) Appl. No.: 14/440,967

(22) PCT Filed: Nov. 21, 2013

(86) PCT No.: PCT/JP2013/081401
§ 371 (c)(1),
(2) Date: May 6, 2015

(87) PCT Pub. No.: WO2014/084117
PCT Pub. Date: Jun. 5, 2014

(65) Prior Publication Data
US 2015/0285869 A1 Oct. 8, 2015

(30) Foreign Application Priority Data
Nov. 29, 2012 (JP) .................................. 2012-261242

(51) Int. Cl.
*G01R 31/36* (2006.01)
*H01M 10/48* (2006.01)
(Continued)

(52) U.S. Cl.
CPC ....... *G01R 31/3662* (2013.01); *G01R 31/361* (2013.01); *H01M 10/4285* (2013.01);
(Continued)

(58) Field of Classification Search
CPC .............. G01R 31/3662; G01R 31/361; G01R 31/3651; H01M 10/4285; H01M 10/48; H01M 10/052
See application file for complete search history.

(56) References Cited

U.S. PATENT DOCUMENTS 8,903,667 B2 * 12/2014 Sato ..................... G01R 31/362
702/63
2002/0030494 A1 * 3/2002 Araki ................... G01R 31/361
324/427
(Continued)

FOREIGN PATENT DOCUMENTS

| JP | 8 140270 | 5/1996 |
|---|---|---|
| JP | 2006 30080 | 2/2006 |

(Continued)

OTHER PUBLICATIONS

International Search Report dated Feb. 10, 2014 in PCT/JP2013/081401 Filed Nov. 21, 2013.
(Continued)

*Primary Examiner* — Khamdan N. Alrobaie
(74) *Attorney, Agent, or Firm* — Oblon, McClelland, Maier & Neustadt, L.L.P.

(57) ABSTRACT

A battery internal state estimation apparatus including: an internal state estimation unit, which inputs at least one of measured values obtained by a battery measurement unit at preset sampling intervals including a current flowing through a battery, an inter-terminal voltage, a temperature of the battery, and an ambient air temperature, for estimating, based on the measured values, at least one of a state of charge, internal temperature, capacity, and internal resistance of the battery as an internal state of the battery; and an internal state correction unit for correcting estimated values of the internal state obtained by the internal state estimation unit so that the estimated values are not contradictory at least
(Continued)

to qualitative properties of the battery, and outputting the corrected values to an output unit.

27 Claims, 9 Drawing Sheets

(51) Int. Cl.
  *H01M 10/42* (2006.01)
  *H01M 10/052* (2010.01)
(52) U.S. Cl.
  CPC ......... *H01M 10/48* (2013.01); *G01R 31/3651* (2013.01); *H01M 10/052* (2013.01)

(56) References Cited

U.S. PATENT DOCUMENTS

| | | | |
|---|---|---|---|
| 2010/0213946 A1* | 8/2010 | Kirchev | G01R 19/16542 324/427 |
| 2010/0280777 A1 | 11/2010 | Jin et al. | |
| 2010/0283471 A1 | 11/2010 | Lim et al. | |
| 2010/0318252 A1* | 12/2010 | Izumi | B60K 6/28 701/22 |
| 2011/0161025 A1* | 6/2011 | Tomura | G01R 31/3651 702/63 |
| 2012/0004875 A1 | 1/2012 | Maeda et al. | |
| 2015/0088443 A1* | 3/2015 | Lorin | G01R 31/3624 702/63 |

FOREIGN PATENT DOCUMENTS

| | | |
|---|---|---|
| JP | 2006 105821 | 4/2006 |
| JP | 2011 515651 | 5/2011 |
| JP | 2011-257207 | 12/2011 |
| JP | 2012-10492 | 1/2012 |
| WO | 2012 011472 | 1/2012 |
| WO | WO 2012/088555 A1 | 7/2012 |

OTHER PUBLICATIONS

Office Action dated Oct. 29, 2018, in Indian Patent Application No. 2818/CHENP/2015.

* cited by examiner

BATTERY INTERNAL STATE ESTIMATION APPARATUS

TECHNICAL FIELD

The present invention relates to a battery internal state estimation apparatus, and more particularly, to a battery internal state estimation apparatus for estimating, in a secondary battery, an internal state of a battery, such as a state of charge.

BACKGROUND ART

When a secondary battery is used, it is necessary to know an internal state of the battery, such as a state of charge. The internal state of the battery may, however, not be directly measured but estimated based on an inter-terminal voltage, current, or the like of the battery. In the case of the state of charge, for example, there have been known a current integration method in which the state of charge is calculated by integrating the current and an open circuit voltage method in which the state of charge is estimated based on the inter-terminal voltage obtained under a state in which no current flows through the battery (see, for example, Patent Literature 1 and Patent Literature 2).

However, the current integration method requires the state of charge at an initial time, whereas the open circuit voltage method cannot be used under a state in which the current flows. Accordingly, a method using those methods in combination is required. In Patent Literature 2, for example, there is disclosed a method in which the open circuit voltage method is used under the state in which no current flows and the current integration method is used while the current flows.

In both of the current integration method and the open circuit voltage method, the state of charge is calculated based on battery characteristic parameters representing battery characteristics, but the battery characteristic parameters may contain errors owing to temperature, a manufacturing error, deterioration of the battery, and the like. Those errors cause an error in the estimation of the state of charge. If a plurality of methods are used in combination, there has been a problem in that because the respective methods have their own errors, the estimated value of the internal state may discontinuously change at the time when one of the plurality of methods is switched to another.

Further, in Patent Literature 1, there is disclosed a method in which an adaptive filter is used when a plurality of methods are used in combination. In this method, both of the two methods are constantly used, and the results of the two methods are continuously corrected respectively, to thereby prevent the above-mentioned discontinues change. However, in exchange for this, if the battery characteristic parameters contain errors, this method causes an action contradictory to qualitative properties of the battery. Specifically, for example, the state of charge is displayed as if the state of charge were decreasing during the charging of the battery, or the state of charge changes even under the state in which no current flows. Such an action leads to a problem if a host system using the battery is designed on the premise of the qualitative properties of the battery.

Those problems owe to the errors of the battery characteristic parameters. Thus, in Patent Literature 3, for example, there is disclosed a method of estimating the errors of the battery characteristic parameters. In this method, however, the method of estimating the errors of the parameters itself includes parameters representing change characteristics of the battery characteristic parameters, and hence similar problems occur if the change characteristic parameters of the battery characteristics contain errors.

CITATION LIST

Patent Literature

[PTL 1] JP 2006-105821 A
[PTL 2] JP 8-140270 A
[PTL 3] WO 2012/011472 A1

SUMMARY OF INVENTION

Technical Problem

As described above, in the methods disclosed in Patent Literatures 1 to 3, there has been a problem in that because those methods cause the action contradictory to the qualitative properties of the battery if the battery characteristic parameters contain errors, such an action leads to a problem in the case where the host system using the battery is designed on the premise of the qualitative properties of the battery.

Moreover, in the method disclosed in Patent Literature 2, there has been a problem in that because the current integration method and the open circuit voltage method are used in combination and because the respective methods contain their own errors, the estimated value of the internal state changes in a discontinuous manner when one of the plurality of methods is switched to another.

The present invention has been made in order to solve the above-mentioned problems, and has an object to provide a battery internal state estimation apparatus capable of estimating an internal state of a battery so that the estimated internal state is not contradictory to qualitative properties of the battery.

Solution to Problem

According to one embodiment of the present invention, there is provided a battery internal state estimation apparatus for estimating an internal state of a battery, including: an internal state estimation unit for estimating, based on a current value I(t) of current flowing through the battery at a sampling time t and an inter-terminal voltage V(t) of the battery, which are measured at preset sampling intervals h, a state of charge of the battery, or in addition to the state of charge, at least one of an internal temperature of the battery and an internal resistance of the battery, and outputting, as an internal state vector x(t) of the battery, the estimated state of charge of the battery, or the estimated at least one of the internal temperature of the battery and the internal resistance of the battery in addition to the state of charge; and an internal state correction unit for correcting a value of each of elements of the internal state vector x(t) obtained by the internal state estimation unit, and outputting the corrected values as a corrected value x'(t) of the internal state vector. The internal state correction unit is configured to: calculate a difference vector $\Delta x$, which is a difference between the internal state vector x(t) obtained by the internal state estimation unit and a corrected value x'(t−h) of the internal state vector in last sampling; determine whether or not an absolute value $|\Delta S|$ of an element $\Delta S$ representing the state of charge among elements of the difference vector $\Delta x$ is equal to or larger than an absolute value $|\Delta S_{I(t)}|$ of a change $\Delta S_{I(t)}$ in state of charge obtained based on the current value I(t); set, when the absolute value |ΔS| is equal to or larger than the absolute value |ΔS$_{I(t)}$|, a value obtained by adding the corrected value x'(t−h) of the internal state vector in the last sampling to a value obtained by scaling the difference vector Δx so that the element ΔS representing the state of charge becomes the same as the change ΔS$_{I(t)}$ in state of charge, as the corrected value x'(t) of the internal state vector; and when the absolute value |ΔS| is smaller than the absolute value |ΔS$_{I(t)}$|: set, when the current value I(t) and the element ΔS representing the state of charge have the same sign, the internal state vector x(t) obtained by the internal state estimation unit as the corrected value x'(t) of the internal state vector; and set, when the current value I(t) and the element ΔS representing the state of charge have different signs, the corrected value x'(t−h) in the last sampling as the corrected value x'(t) of the internal state vector without change.

Advantageous Effects of Invention

According to the one embodiment of the present invention, there is provided the battery internal state estimation apparatus for estimating the internal state of the battery, including: the internal state estimation unit for estimating, based on the current value I(t) of the current flowing through the battery at the sampling time t and the inter-terminal voltage V(t) of the battery, which are measured at the preset sampling intervals h, the state of charge of the battery, or in addition to the state of charge, at least one of the internal temperature of the battery and the internal resistance of the battery, and outputting, as the internal state vector x(t) of the battery, the estimated state of charge of the battery, or the estimated at least one of the internal temperature of the battery and the internal resistance of the battery in addition to the state of charge; and the internal state correction unit for correcting the value of each of the elements of the internal state vector x(t) obtained by the internal state estimation unit, and outputting the corrected values as the corrected value x'(t) of the internal state vector. The internal state correction unit is configured to: calculate the difference vector Δx, which is the difference between the internal state vector x(t) obtained by the internal state estimation unit and the corrected value x'(t−h) of the internal state vector in the last sampling; determine whether or not the absolute value |ΔS| of the element ΔS representing the state of charge among the elements of the difference vector Δx is equal to or larger than the absolute value |ΔS$_{I(t)}$| of the change ΔS$_{I(t)}$ in state of charge obtained based on the current value I(t); set, when the absolute value |ΔS| is equal to or larger than the absolute value |ΔS$_{I(t)}$|, the value obtained by adding the corrected value x'(t−h) of the internal state vector in the last sampling to the value obtained by scaling the difference vector Δx so that the element ΔS representing the state of charge becomes the same as the change ΔS$_{I(t)}$ in state of charge, as the corrected value x'(t) of the internal state vector; and when the absolute value |ΔS| is smaller than the absolute value |ΔS$_{I(t)}$|: set, when the current value I(t) and the element ΔS representing the state of charge have the same sign, the internal state vector x(t) obtained by the internal state estimation unit as the corrected value x'(t) of the internal state vector; and set, when the current value I(t) and the element ΔS representing the state of charge have different signs, the corrected value x'(t−h) in the last sampling as the corrected value x'(t) of the internal state vector without change. Thus, the battery internal state estimation apparatus can estimate the internal state of the battery so that the estimated internal state is not contradictory to the qualitative properties of the battery.

DESCRIPTION OF EMBODIMENTS

First Embodiment

Figure 1:
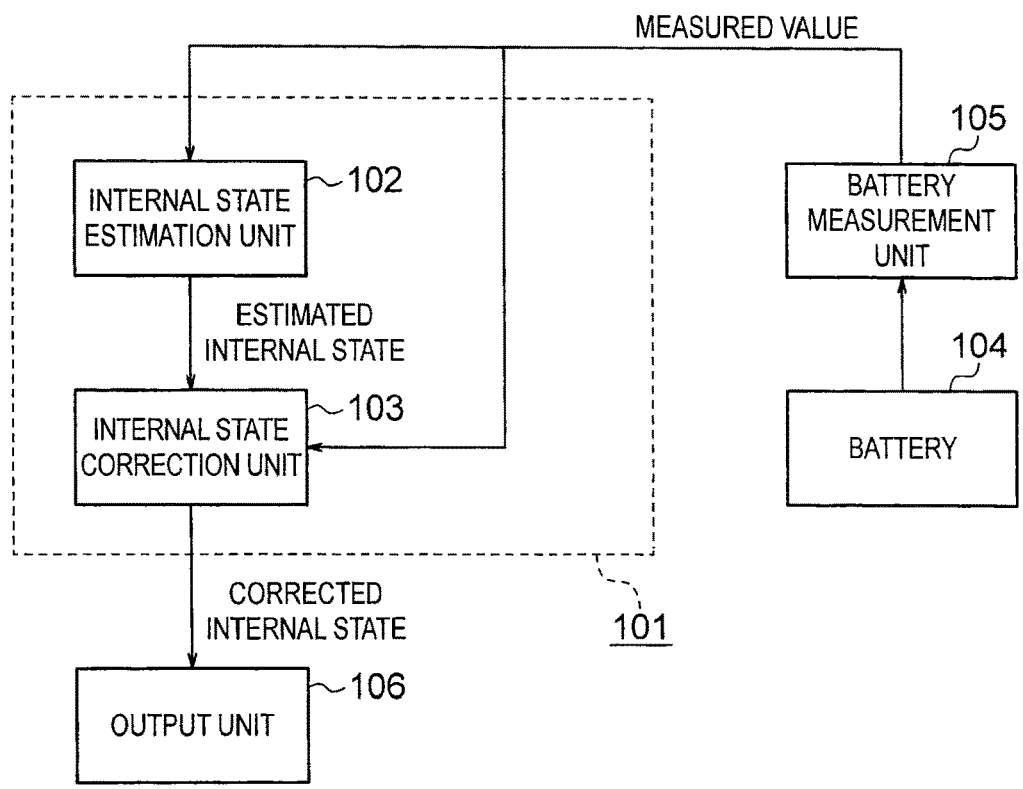
FIG. 1 is a configuration diagram illustrating a configuration of a battery internal state estimation apparatus according to a first embodiment of the present invention.

Referring to FIG. 1, a description is given of a battery internal state estimation apparatus according to a first embodiment of the present invention. The battery internal state estimation apparatus 101 according to the first embodiment includes an internal state estimation unit 102 and an internal state correction unit 103. In the battery internal state estimation apparatus 101, the internal state estimation unit 102 first estimates an internal state of a battery, and outputs an estimated value of the internal state. The internal state correction unit 103 next corrects the estimated value, and the corrected value is output as a value of the internal state of the battery. The battery internal state estimation apparatus 101 inputs measured values obtained by a battery measurement unit 105 for measuring a battery 104, and outputs to an output unit 106 the value of the internal state of the battery 104 obtained by the internal state correction unit 103. The output unit 106 is formed of a display device such as a liquid crystal display, and the output unit 106 displays the value of the internal state.

The battery measurement unit 105 performs measurement about the battery 104 at preset sampling intervals h. The measured values of the battery 104 obtained by the battery measurement unit 105 are an inter-terminal voltage of the battery 104 and a current value of current flowing through the battery 104. The measured values obtained by the battery measurement unit 105 may further include a surface temperature of the battery 104, a terminal temperature (electrode temperature) of the battery 104, and an ambient air temperature (environmental temperature) of the battery 104. The battery measurement unit 105 thus measures, as the measured values of the battery 104, at least one of the inter-terminal voltage of the battery 104, the current flowing through the battery 104, the surface temperature of the battery 104, the terminal temperature of the battery 104, and the ambient air temperature of the battery 104, and inputs the obtained measured values to the battery internal state estimation apparatus 101. The battery internal state estimation apparatus 101 estimates the internal state of the battery 104 based on the input measured values. Examples of the internal state to be estimated by the battery internal state estimation apparatus 101 include a state of charge (SOC) of the battery 104, an internal temperature of the battery 104, a capacity of the battery 104, an internal resistance of the battery 104, and a quantity indicating a temporary state of a relaxation process in which the battery 104 is driven by a potential gradient, substance concentration gradient, temperature gradient, or the like inside the battery 104.

The battery 104 is formed of, for example, a lithium secondary battery or a lithium ion secondary battery. The battery 104 is electrically connected to a charging device or a load, and is used as a part of a host system which includes the battery 104, the charging device and/or the load. The battery 104 uses, as its operation principle, physical phenomena such as a chemical reaction and substance diffusion. However, in the control and design of the system, details of those physical phenomena are not taken into consideration in normal cases, and a relatively simplified assumption that the battery 104 is for storing electricity is made.

Figure 2:
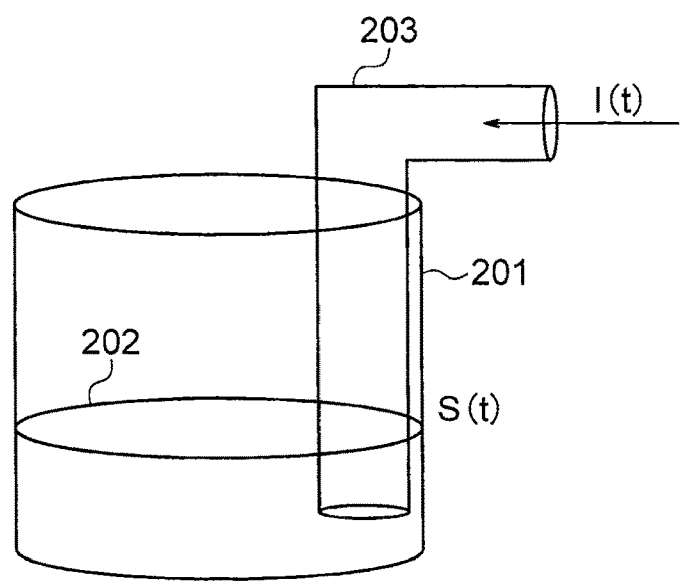
FIG. 2 is a diagram illustrating a water tank model obtained by modeling a battery as an estimation target of the battery internal state estimation apparatus according to the first embodiment of the present invention.

The simplest model (equivalent circuit model) of the battery 104 is such a water tank model as illustrated in FIG. 2. Electricity stored in the battery 104 corresponds to water 202 stored in a water tank 201, and a current I(t) [A] flowing through the battery 104 at a time t corresponds to a flow rate of the water flowing at the time t through a pipe 203 connected to the water tank 201. A ratio of an amount of the water 202 stored in the water tank 201 to a capacity of the water tank 201 thus corresponds to a state of charge S(t), and this ratio is expressed in percentage with 100 representing the capacity of the water tank 201. In this model, when the capacity of the battery is represented by Qmax [Ah], Relational Expression (1) holds true.

$$\frac{Q_{max}}{100} \frac{dS}{dt}(t) = I(t) \quad (1)$$

The state of charge S(t) cannot be directly measured, and hence the state of charge S(t) is calculated based on Relational Expression (1). This method is called "current integration method".

However, Relational Expression (1) merely expresses a relationship between an increase or decrease of the state of charge between two different times and the current, and hence in order to calculate an absolute state of charge, it is necessary to determine a state of charge S ($t_0$) at a given reference time $t_0$. There has been known, as a method for this determination, an open circuit voltage method using a relationship between an inter-terminal voltage of the battery 104 at the time when no current flows through the battery 104 and the state of charge. Namely, assuming that no current flows through the battery 104 at the reference time $t_0$, a relationship between a voltage V($t_0$) and the state of charge S($t_0$) is used to determine the state of charge S($t_0$).

It is assumed here that the measured value of the current obtained by the battery measurement unit 105 contains an error and the current is measured to be slightly larger than a true current value. When a magnitude of this error is represented by ε[A], a state of charge S($t_1$) at a time $t_1$ is calculated through Expression (2).

$$S(t_1) = S(t_0) + \frac{100}{Q_{max}} \int_{t_0}^{t_1} I(t)dt + \epsilon(t_1 - t_0) \quad (2)$$

This means that even if ε is a minute error of current, this error ε results in a significant degree of error of the state of charge S when the battery 104 is used for a long period of time. Although the open circuit voltage method is used as a method of correcting this error, the open circuit voltage method cannot be used while the current flows through the battery 104. Therefore, in a case where the battery 104 is used for a long period of time, the state of charge S is corrected to a significant degree after the use. On the other hand, even when the measured value obtained by the battery measurement unit (such as an ammeter) 105 is correct, if there are errors in the battery capacity Qmax and the relationship between the state of charge and the inter-terminal voltage of the battery, similar correction is performed.

Incidentally, in the simplified model of the water tank, the following "qualitative properties of the battery 104" are self-evident, for example:

(a) the state of charge S does not change if the current I is 0;

(b) the state of charge S increases while the battery 104 is being charged; and (c) the state of charge S decreases while the battery 104 is being discharged.

Therefore, if the state of charge S is estimated to significantly change (increase or decrease) irrespective of the fact that no current flows, such estimation is beyond the assumption of the host system.

The battery internal state estimation apparatus 101 according to the first embodiment has been made in view of the above-mentioned problem, and has a feature in estimating the internal state of the battery 104 so that the estimated value is not contradictory to the "qualitative properties of the battery 104" of (a) to (c) assumed by the host system.

In the first embodiment, the internal state estimation unit 102 estimates the state of charge through use of the current flowing through the battery 104 or an open circuit voltage thereof, and outputs the estimated value as the state of charge S(t). In this embodiment, the estimation method is not particularly limited to any specific method, and for example, the method disclosed in Patent Literature 1 may also be used.

Figure 3:
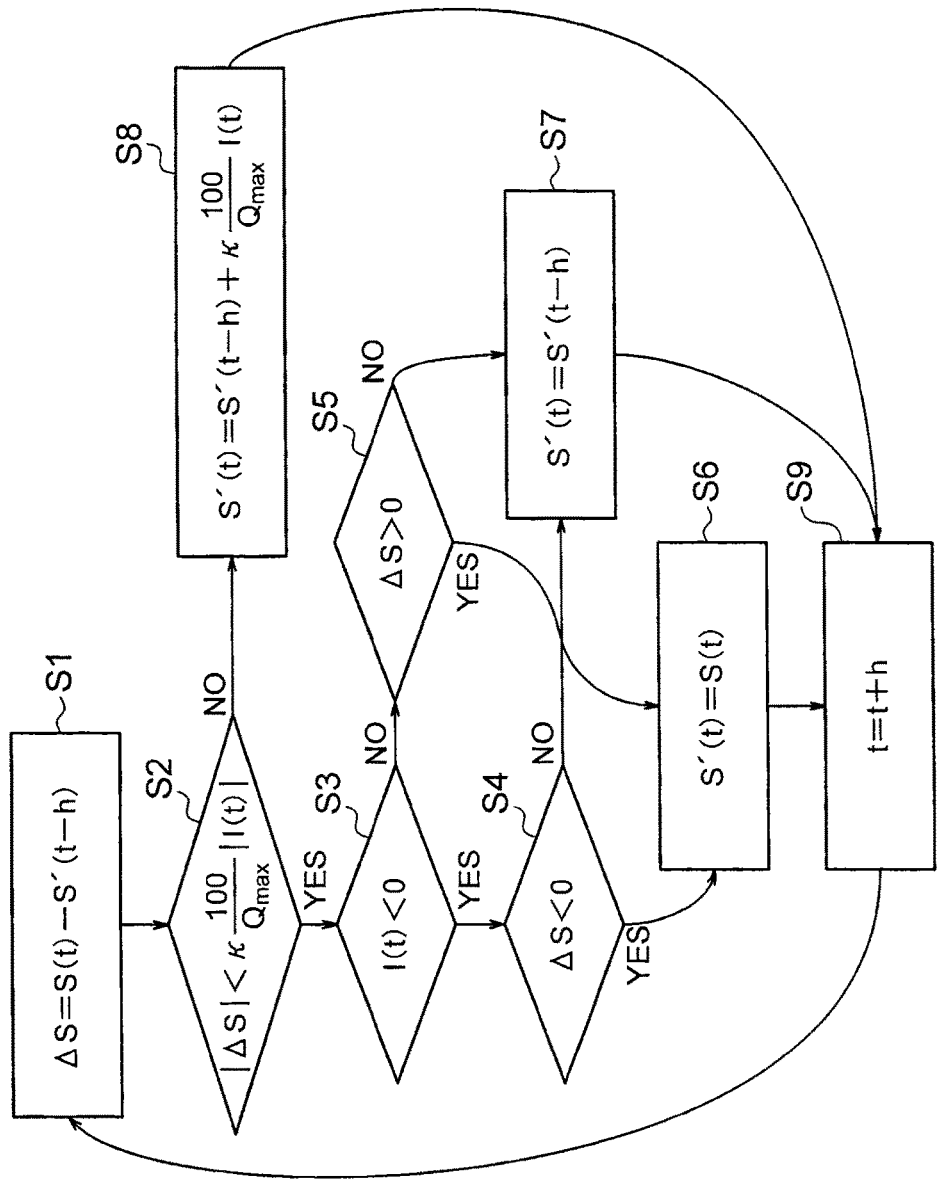
FIG. 3 is a flow chart illustrating a flow of processing performed by internal state correction unit of the battery internal state estimation apparatus according to the first embodiment of the present invention.

The internal state correction unit 103 inputs the measured value obtained by the battery measurement unit 105, such as the current I(t) flowing through the battery 104, and the state of charge S(t) estimated by the internal state estimation unit 102, and outputs a state of charge S'(t) obtained by correcting the state of charge S(t). FIG. 3 illustrates a flow chart of the internal state correction unit 103 according to the first embodiment.

As illustrated in FIG. 3, in Step S1, the internal state correction unit 103 first uses Expression (3) to calculate a difference ΔS between a corrected value S'(t−h) of the state of charge at a last sampling time (t−h) and the state of charge S(t) at a current sampling time t estimated by the internal state estimation unit 102. In this expression, h represents the sampling interval.

$$\Delta S = S(t) - S'(t-h) \tag{3}$$

Next, in Step S2, the internal state correction unit 103 determines whether or not Expression (4) holds true with respect to a preset constant κ. Namely, the internal state correction unit 103 calculates a value obtained by multiplying an absolute value |I(t)| of the current flowing through the battery 104 by a preset coefficient (100×κ/Qmax) as an absolute value $|\Delta S_{I(t)}|$ (=|I(t)|×100×κ/Qmax) of a change $\Delta S_{I(t)}$ in state of charge obtained based on the current value I(t), and compares an absolute value |ΔS| of ΔS calculated in Step S1 with the absolute value $|\Delta S_{I(t)}|$. In this expression, the constant κ represents a value set to be larger than the sampling interval h.

$$|\Delta S| < \kappa \frac{100}{Q_{max}} |I(t)| \tag{4}$$

When Expression (4) holds true, the flow proceeds to Step S3. When Expression (4) does not hold true, the flow proceeds to Step S8. In Step S3, the internal state correction unit 103 determines whether or not the current I(t) is negative. When the current I(t) is negative, the flow proceeds to Step S4, and in Step S4, the internal state correction unit 103 determines whether or not ΔS is negative. On the other hand, when the current I(t) is not negative in Step S3, the flow proceeds to Step S5, and the internal state correction unit 103 determines whether or not ΔS is positive.

In the determination of Steps S3 to S5, when the current I(t) is negative and ΔS is also negative, or when the current I(t) is positive and ΔS is also positive, that is, the current I(t) and ΔS have the same sign, the flow proceeds to Step S6. In Step S6, the internal state correction unit 103 uses Expression (5) to determine the corrected value S'(t) of the state of charge. Namely, the internal state correction unit 103 determines the estimated value S(t) of the state of charge as the corrected value S'(t) of the state of charge without change. Note that, to give a supplementary description, when the current I(t) is 0, Expression (4) does not hold true in the determination of Step S2 and the flow thus proceeds to Step S8, and hence in Step S3, only the determination as to whether the current I(t) is positive or negative is made. After the end of the processing of Step S6, the flow proceeds to Step S9.

$$S'(t) = S(t) \tag{5}$$

On the other hand, in the determination of Steps S3 to S5, when the current I(t) and ΔS do not satisfy any of the conditions that "the current I(t) is negative and ΔS is also negative" and "the current I(t) is positive and ΔS is also positive", that is, the current I(t) and ΔS have different signs, in Step S7, the internal state correction unit 103 uses Expression (6) to determine the corrected value S'(t) of the state of charge. Namely, without updating the corrected value S' of the state of charge in a practical sense, the internal state correction unit 103 keeps the corrected value S'(t−h) of the state of charge at the last sampling time (t−h) unchanged. After the end of the processing of Step S7, the flow proceeds to Step S9.

$$S'(t) = S'(t-h) \tag{6}$$

Meanwhile, in Step S8, as the corrected value S'(t) of the state of charge at the sampling time t, the internal state correction unit 103 uses Expression (7) to calculate the corrected value S'(t) of the state of charge, and the flow proceeds to Step S9. Namely, in Step S8, the internal state correction unit 103 first multiplies the current I(t) by the preset coefficient (100×κ/Qmax) to calculate the change $\Delta S_{I(t)}$ in state of charge based on the current I(t). The internal state correction unit 103 next adds the change $\Delta S_{I(t)}$ in state of charge to the corrected value S'(t−h) of the state of charge in the last sampling, to thereby calculate the corrected value S'(t) of the state of charge at the sampling time t.

$$S'(t) = S'(t-h) + \kappa \frac{100}{Q_{max}} I(t) \tag{7}$$

In Step S9, the internal state correction unit 103 increments the sampling time t by the sampling interval set to h (t=t+h), and the flow returns to Step S1. The internal state correction unit 103 then repeats the processing of Steps S1 to S9 for each sampling time period. In this case, it is assumed that the current value is positive while the battery is being charged and negative while the battery is being discharged, and for example, |ΔS| and |I(t)| represent the absolute values of ΔS and I(t), respectively.

With this, for example, in the case where no current flows through the battery 104, even if the state of charge S(t) estimated by the internal state estimation unit 102 continuously changes (increases or decreases), Expression (4) does not hold true because the current I(t) is 0. Accordingly, S'(t) is calculated through Expression (7) in Step S8, and the state of charge S'(t) does not change because I(t) is 0.

Further, while the battery 104 is being charged, the current I(t) is positive, and even if the state of charge S(t) decreases during the charge, S'(t) is calculated through Expression (6) in Step S7. Therefore, S'(t) at least does not decrease.

Further, while the battery 104 is being discharged, the current I(t) is negative, and even if S(t) increases during the discharge, S'(t) is calculated through Expression (6) in Step S7. Therefore, S'(t) at least does not increase.

When none of the above-mentioned cases applies, the corrected state of charge S'(t) is calculated through Expression (5) in Step S6, and the state of charge estimated by the internal state estimation unit 102 is used without change.

With this, when the estimated value of the state of charge of the battery 104 obtained by the internal state estimation unit 102 is not contradictory to the conditions of the "qualitative properties of the battery 104" represented by (a) to (c), the battery internal state estimation apparatus 101 outputs the estimated value of the state of charge of the battery 104 obtained by the internal state estimation unit 102 to the output unit 106 without change. On the other hand, when the estimated value of the state of charge of the battery 104 obtained by the internal state estimation unit 102 is contradictory to the conditions of the "qualitative properties of the battery 104", the battery internal state estimation apparatus 101 controls the internal state correction unit 103 to correct the estimated value so that the estimated value is not contradictory to the "qualitative properties of the battery 104", and outputs the corrected estimated value to the output unit 106.

As described above, the following effect is achieved in the first embodiment. Namely, even when the ammeter forming the battery measurement unit 105, the battery capacity, the relational expression between the state of charge and the inter-terminal voltage, or the like contains an error, by virtue of the function of the internal state correction unit 103, it is possible to estimate the state of charge that is not contradictory to the "qualitative properties of the battery" represented by (a) to (c).

Note that, in the above description of the first embodiment, the relationships between the current flowing through the battery 104 and the state of charge are taken as an example of the qualitative properties of the battery 104, but in the first embodiment, the qualitative properties of the battery 104 are not limited thereto. A similar internal state correction unit 103 can be configured also with regard to a relationship between an arbitrary internal state of the battery 104 and an arbitrary measured value of the battery 104 or a relationship between arbitrary two internal states of the battery 104.

As described above, the battery internal state estimation apparatus 101 according to the first embodiment includes: the internal state estimation unit 102, which inputs the measured value obtained by the battery measurement unit 105 at the preset sampling intervals, that is, at least one of the current flowing through the battery 104, the inter-terminal voltage, the battery temperature, and the ambient air temperature, so as to estimate, based on the input measured value, at least one of the state of charge of the battery 104, the internal temperature of the battery 104, the capacity of the battery 104, and the internal resistance of the battery 104 as the internal state of the battery 104; and the internal state correction unit 103 for correcting the estimated value of the internal state obtained by the internal state estimation unit 102 so that the estimated value is not contradictory at least to the conditions of the "qualitative properties of the battery 104" represented by (a) to (c). Accordingly, even when the estimated value of the internal state of the battery 104 obtained by the internal state estimation unit 102 does not satisfy the conditions of the "qualitative properties of the battery 104" represented by (a) to (c), the internal state correction unit 103 corrects the estimated value so that the estimated value is not contradictory at least to those conditions, and hence it is possible to estimate the internal state of the battery 104 so that the estimated internal state is not contradictory to the qualitative properties of the battery 104 assumed by the host system.

Further, the internal state correction unit 103 determines whether or not the estimated value of the internal state of the battery 104 obtained by the internal state estimation unit 102 satisfies the conditions of the "qualitative properties of the battery 104". When the estimated value satisfies the conditions, the internal state correction unit 103 outputs the estimated value without change. When the estimated value does not satisfy the conditions, the internal state correction unit 103 outputs the estimated value in the last sampling. It is thus possible to output the estimated value of the internal state that is not contradictory at least to the conditions.

Further, the internal state estimation unit 102 is configured to estimate the state of charge of the battery 104 as the internal state thereof, and the conditions to be used by the internal state correction unit 103 are the following conditions representing such a change of the state of charge based on the current flowing through the battery 104: the state of charge does not change when no current flows through the battery 104; the state of charge increases while the battery 104 is being charged; and the state of charge decreases while the battery 104 is being discharged. With this, it is possible to obtain the estimated value of the state of charge that is not contradictory to the "qualitative properties of the battery 104" assumed from the current flowing through the battery 104.

Further, the internal state correction unit 103 compares the absolute value of the difference ($\Delta S$) between the estimated value of the state of charge in the current sampling output from the internal state estimation unit 102 and the corrected estimated value of the state of charge output from the internal state correction unit 103 in the last sampling with the value obtained by multiplying the measured value of the current in the current sampling by the preset coefficient ($\kappa \times (100/Q_{max}) \times |i(t)|$), and based on the comparison result and the sign of the current, corrects the estimated value of the state of charge in the current sampling. With this, it is possible to obtain the estimated value of the state of charge that is not contradictory to the "qualitative properties of the battery 104".

Further, another feature of the first embodiment resides in that the internal state estimation unit 102 has the equivalent circuit model of the battery 104 represented by the water tank model illustrated in FIG. 2 and estimates, based on the equivalent circuit model, the state of charge according to the current value flowing through the battery 104 and the inter-terminal voltage of the battery 104, and that the internal state correction unit 103 sets the state of charge estimated by the internal state estimation unit 102 as an internal state vector to calculate the corrected value of the internal state vector.

Second Embodiment

A description is given of a battery internal state estimation apparatus 101 according to a second embodiment of the present invention. In the above description of the first embodiment, the internal state correction unit 103 corrects only the state of charge of the battery 104 estimated by the internal state estimation unit 102. On the other hand, in the battery internal state estimation apparatus 101 according to the second embodiment of the present invention, the internal state correction unit 103 also corrects other battery internal states estimated by the internal state estimation unit 102, that is, the state of charge of the battery 104, the internal temperature of the battery 104, the capacity of the battery 104, the internal resistance of the battery 104, and the like.

Figure 4:
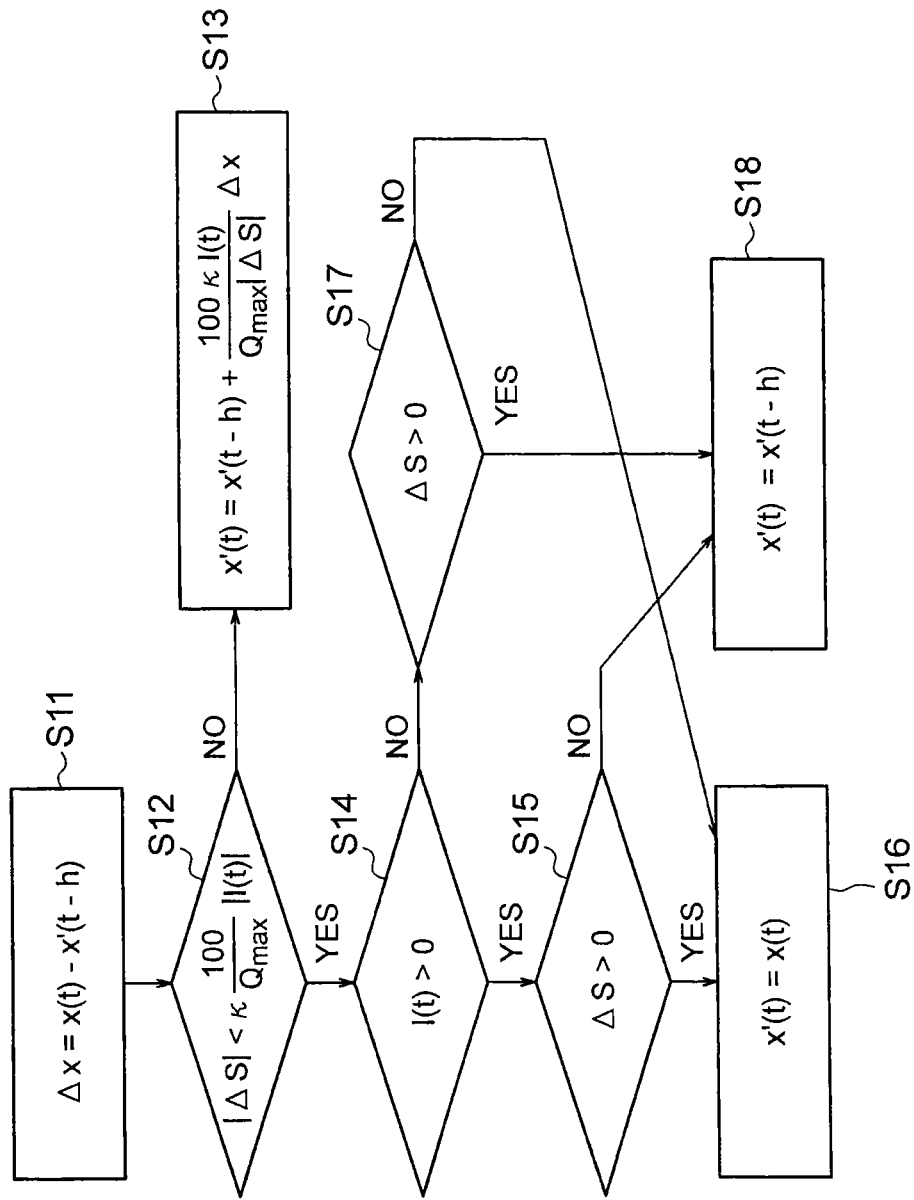
FIG. 4 is a flow chart illustrating a flow of processing performed by internal state correction unit of a battery internal state estimation apparatus according to a second embodiment of the present invention.

FIG. 4 is a flow chart illustrating a flow of processing performed by the internal state correction unit 103 according to this embodiment. Note that, a configuration of the battery internal state estimation apparatus 101 according to this embodiment is the same as the one illustrated in FIG. 1, and hence a description thereof is omitted here.

In FIG. 4, it is assumed that a vector x represents the estimated value of the battery internal state obtained by the internal state estimation unit 102. The vector x is a vector having n elements ($n \geq 1$). Namely, the vector x includes, as its n elements, at least one of the estimated value of the state of charge of the battery 104, the estimated value of the internal temperature of the battery 104, the estimated value of the capacity of the battery 104, the estimated value of the internal resistance of the battery 104, and the like that are obtained by the internal state estimation unit 102. Therefore, the first embodiment described above can be considered as an embodiment in the case of n=1 in this embodiment. In FIG. 4, it is further assumed that a vector x' represents a corrected value of the vector x obtained by the internal state correction unit 103.

In this case, as illustrated in FIG. 4, in Step S11, the internal state correction unit 103 first calculates a difference between an estimated value x(t) of the battery internal state in the current sampling at the time t and a corrected value x'(t−h) of the battery internal state in the last sampling, and sets the difference as a difference vector Δx. In other words, the internal state correction unit 103 calculates a difference between each element of the internal state vector x(t) in the current sampling and each corresponding element of the corrected value x'(t−h) of the internal state vector in the last sampling.

In Step S12, the internal state correction unit 103 next sets, among the elements of the difference vector Δx calculated in Step S11, an element representing the state of charge ΔS. When the internal state vector x(t) includes the n elements and a first element thereof represents the state of charge, ΔS is the first element of the difference vector Δx. At this time, the internal state correction unit 103 calculates the value obtained by multiplying the absolute value |I(t)| of the current flowing through the battery 104 by the preset coefficient (100×κ/Qmax) as the absolute value |ΔS$_{I(t)}$|(=|I(t)|×100×κ/Qmax) of the change ΔS$_{I(t)}$ in state of charge obtained based on the current value I(t). The internal state correction unit 103 next compares the absolute value |ΔS| of ΔS with the absolute value |ΔS$_{I(t)}$|, and when |ΔS| is equal to or larger than |ΔS$_{I(t)}$|, the flow proceeds to Step S13. In Step S13, the internal state correction unit 103 uses Expression (8) to calculate a corrected value x'(t) of the state of charge. Namely, the internal state correction unit 103 first multiples the current I(t) by the preset coefficient (100×κ/Qmax) to calculate the change ΔS$_{I(t)}$(=I(t)×100×κ/Qmax) in state of charge based on the current I(t). The internal state correction unit 103 next multiples Δx by (ΔS$_{I(t)}$/|ΔS|), to thereby calculate a value obtained by scaling Δx so that ΔS becomes the same as ΔS$_{I(t)}$. The internal state correction unit 103 next adds the value obtained by scaling Δx to the corrected value x'(t−h) of the internal state in the last sampling, to thereby calculate the corrected value x'(t) of the state of charge.

$$x'(t) = x'(t-h) + \frac{100\kappa I(t)}{Q_{max}|\Delta S|}\Delta x \qquad (8)$$

On the other hand, when it is determined in Step S12 that |ΔS| is smaller than the absolute value |ΔS$_{I(t)}$| (=|I(t)|×100×κ/Qmax) of the change ΔS$_{I(t)}$ in state of charge obtained based on the current value I(t), the flow proceeds to Step S14. In Step S14, the internal state correction unit 103 determines whether or not the current I(t) is negative. When the current I(t) is negative, the flow proceeds to Step S17, and in Step S17, the internal state correction unit 103 determines whether or not ΔS is negative. On the other hand, when the current I(t) is not negative in Step S14, the flow proceeds to Step S15, and the internal state correction unit 103 determines whether or not ΔS is positive.

When it is determined in Steps S14, S15, and S17 that the current I(t) is negative and ΔS is also negative, or the current I(t) is positive and ΔS is also positive, that is, ΔS and the current I(t) have the same sign, the flow proceeds to Step S16. In Step S16, the internal state correction unit 103 determines the estimated value x(t) of the battery internal state as the corrected value x'(t) of the battery internal state without change (x'(t)=x(t)). Note that, to give a supplementary description, when the current I(t) is 0, the flow proceeds to Step S13 after the determination of Step S12, and hence in Step S14, only the determination as to whether the current I(t) is positive or negative is made.

On the other hand, when it is determined in Steps S14, S15, and S17 that the current I(t) and ΔS do not satisfy any of the conditions that "the current I(t) is negative and ΔS is also negative" and "the current I(t) is positive and ΔS is also positive", that is, ΔS and the current I(t) have different signs, in Step S18, the internal state correction unit 103 determines the corrected value x'(t−h) of the battery internal state in the last sampling as x'(t)(x'(t)=x'(t−h)). Namely, without updating the corrected value x'(t) of the battery internal state, the internal state correction unit 103 keeps the corrected value x'(t−h) of the battery internal state at the last sampling time (t−h) unchanged.

With this configuration, also in the case of estimating the battery internal state other than the state of charge, the internal state estimation unit 102 can estimate the internal state of the battery 104 other than the state of charge so that the estimated internal state is not contradictory to the "qualitative properties of the battery 104" assumed by the host system.

While only the state of charge is a target of correction in the first embodiment in contrast to this configuration, there is such an effect that a calculation amount can be reduced in the first embodiment because the scaling operation of this embodiment can be omitted.

As described above, in this embodiment, the battery measurement unit 105 measures, at the preset sampling intervals h, the current I(t) flowing through the battery 104 and the inter-terminal voltage V(t) of the battery 104. The internal state estimation unit 102 estimates, based on the current I(t) and the inter-terminal voltage V(t), the state of charge of the battery. Alternatively, the internal state estimation unit 102 may estimate the state of charge and at least one of the internal temperature of the battery and the internal resistance of the battery. The internal state estimation unit 102 thus outputs the estimated internal state ΔS the internal state vector x(t) of the battery. The internal state correction unit 103 corrects the internal state vector x(t) obtained by the internal state estimation unit 102, and outputs the corrected internal state vector as the corrected value x'(t) of the internal state vector. In this correction, the internal state correction unit 103 calculates the difference vector Δx, which is the difference between the battery internal state vector x(t) obtained by the internal state estimation unit 102 and the corrected value x'(t−h) of the internal state vector in the last sampling. Then, when the absolute value |ΔS| of the element ΔS representing the state of charge among the elements of the difference vector Δx is larger than the absolute value |ΔS$_{I(t)}$|(=|I(t)|×100κ/Qmax) of the change ΔS$_{I(t)}$ instate of charge obtained based on the current value I(t), the internal state correction unit 103 adds the corrected value x'(t−h) of the internal state vector in the last sampling to the value obtained by scaling the difference vector Δx so that the element ΔS representing the state of charge becomes the same as the change ΔS$_{I(t)}$(=I(t)×100κ/Qmax) in state of charge, and determines the resultant value as the corrected value x'(t) of the internal state vector. Otherwise, when the current value I(t) and the element ΔS representing the state of charge have the same sign, the internal state correction unit 103 determines the internal state vector x(t) obtained by the internal state estimation unit 102 as the corrected value x'(t) of the internal state vector. On the other hand, when the current value I(t) and the element ΔS representing the state of charge have different signs, the internal state correction unit 103 determines the corrected value x'(t−h) in the last sampling as the corrected value x'(t) of the internal state vector without change. With this configuration, also in the case of estimating the battery internal state other than the state of charge, the internal state estimation unit 102 can estimate the internal state of the battery 104 other than the state of charge so that the estimated internal state is not contradictory to the "qualitative properties of the battery 104" assumed by the host system.

Third Embodiment

A description is given of a battery internal state estimation apparatus 101 according to a third embodiment of the present invention. In the battery internal state estimation apparatus 101 according to the third embodiment of the present invention, the internal state estimation unit 102 includes a storage unit (see a storage unit 107 of FIG. 8) to store the battery internal state in the last sampling. The internal state estimation unit 102 estimates the internal state of the battery 104 based on the battery internal state at the last sampling time and the measured values of the battery 104 such as the inter-terminal voltage of the battery 104 and the current flowing through the battery 104. Other configurations and operations are the same as those of the first or second embodiment, and hence a detailed description thereof is omitted here.

Figure 5:
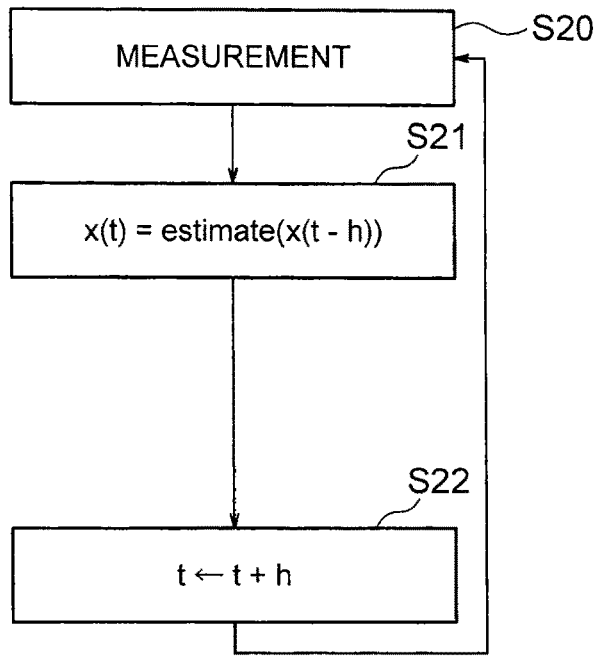
FIG. 5 is a flow chart illustrating a flow of processing of a comparative example for illustrating internal state correction unit of a battery internal state estimation apparatus according to a third embodiment of the present invention.
Figure 6:
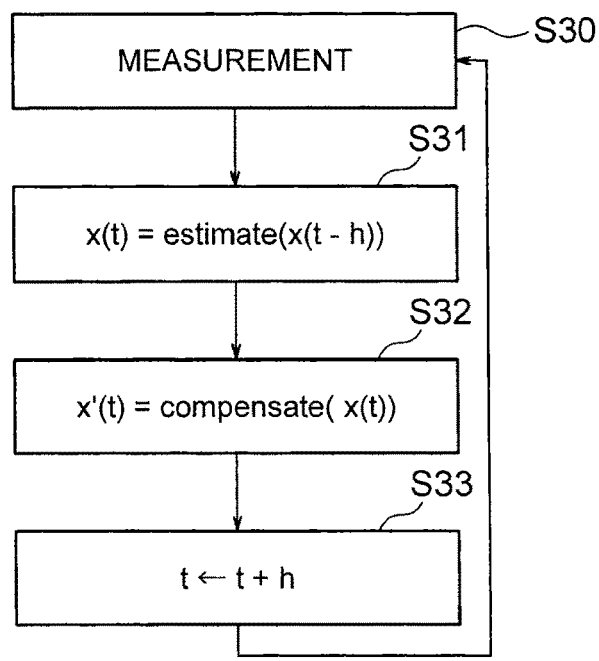
FIG. 6 is a flow chart illustrating a flow of processing of another comparative example for illustrating the internal state correction unit of the battery internal state estimation apparatus according to the third embodiment of the present invention.
Figure 7:
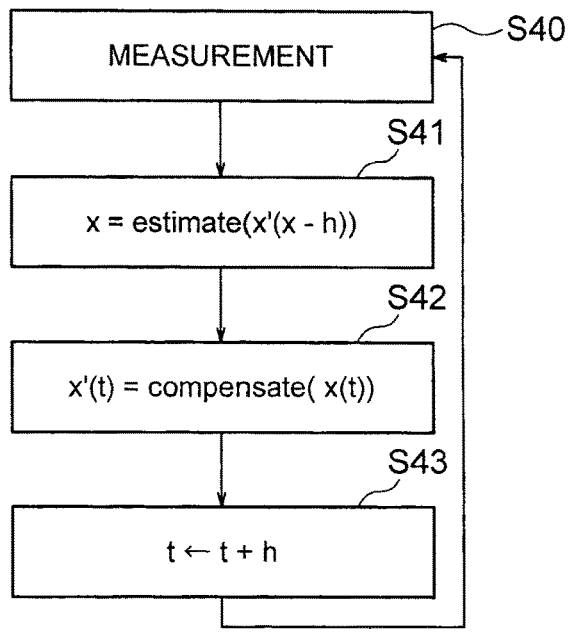
FIG. 7 is a flow chart illustrating a flow of processing performed by the internal state correction unit of the battery internal state estimation apparatus according to the third embodiment of the present invention.

Referring to flow charts of FIG. 5 to FIG. 7, a description is given of the battery internal state estimation apparatus 101 according to this embodiment. It should be noted that FIG. 5 and FIG. 6 illustrate comparative examples to be compared with this embodiment, and FIG. 7 illustrates this embodiment.

In a comparative example illustrated in FIG. 5, in Step S20, the inter-terminal voltage of the battery, the current flowing through the battery, or the like is first measured. Next, in Step S21, based on those measured values of the battery and the battery internal state x(t−h) in the last sampling, a preset function "estimate (x(t−h))" is used to calculate the estimated value x(t) of the battery internal state. In Step S22, the sampling time t is incremented by the sampling interval set to h(t=t+h), and the flow returns to Step S20.

In another comparative example illustrated in FIG. 6, in Step S30, the inter-terminal voltage of the battery, the current flowing through the battery, or the like is first measured. Next, in Step S31, based on those measured values of the battery and the battery internal state x(t−h) in the last sampling, the preset function "estimate(x(t−h))" is used to calculate the estimated value x(t) of the battery internal state. In Step S32, a preset function "compensate (x (t))" is next used to calculate the corrected value x'(t) of the estimated value x(t) of the battery internal state. Next, in Step S33, the sampling time t is incremented by the sampling interval set to h (t=t+h), and the flow returns to Step S30.

FIG. 7 is a flow chart of the battery internal state estimation apparatus 101 according to this embodiment. As illustrated in FIG. 7, in Step S40, the battery measurement unit 105 measures at least one of the inter-terminal voltage of the battery 104, the current flowing through the battery 104, the surface temperature of the battery 104, the terminal temperature of the battery 104, the ambient air temperature of the battery 104, and the like. In Step S41, the internal state estimation unit 102 next uses, based on those measured values of the battery and the corrected value x'(t−h) of the internal state vector in the last sampling, a preset function "estimate(x'(t−h))" to calculate the internal state vector x(t), which is the estimated value of the internal state in the current sampling. In Step S42, the internal state estimation unit 102 next uses a preset function "compensate(x(t))" to calculate the corrected value x'(t) of the estimated value x(t) of the battery internal state. In Step S43, the internal state estimation unit 102 next increments the sampling time t by the sampling interval set to h (t=t+h), and the flow returns to Step S40.

As described above, in this embodiment, the internal state estimation unit 102 calculates the estimated value of the battery internal state based on the measured value of the battery 104 and the corrected value x'(t−h) of the battery internal state in the last sampling. Through use of the corrected value x'(t−h) of the battery internal state in the last sampling that satisfies the "qualitative properties of the battery 104 ", it is possible to estimate the internal state of the battery 104 with more precision.

Note that, the calculation method described in other embodiments of the present invention or a known calculation method disclosed in a related-art document is applicable as the function "estimate". Further, as the function "compensate", it is only necessary to use the correction processing performed by the internal state correction unit 103 described in the other embodiments.

Fourth Embodiment

Figure 8:
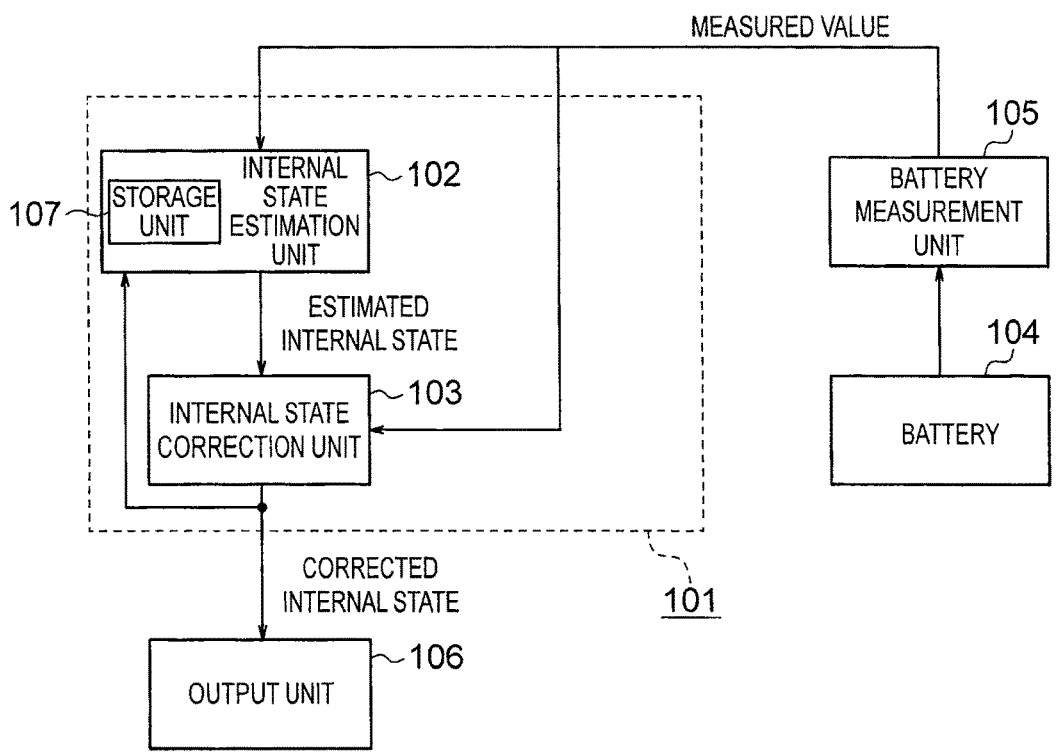
FIG. 8 is a configuration diagram illustrating a configuration of a battery internal state estimation apparatus according to a fourth embodiment of the present invention.
Figure 9:
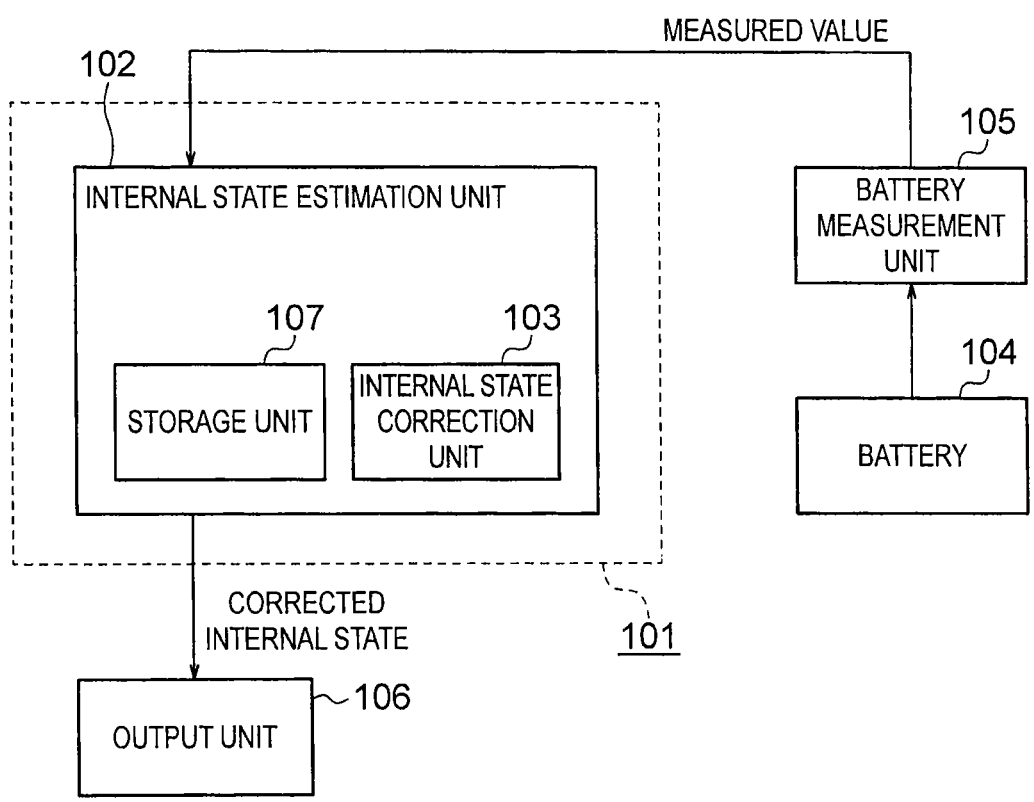
FIG. 9 is a configuration diagram illustrating another configuration of the battery internal state estimation apparatus according to the fourth embodiment of the present invention.

A description is given of a battery internal state estimation apparatus 101 according to a fourth embodiment of the present invention. As illustrated in FIG. 8 or FIG. 9, in the battery internal state estimation apparatus 101 according to the fourth embodiment of the present invention, the internal state estimation unit 102 includes the storage unit 107. In FIG. 8, the internal state estimation unit 102 and the internal state correction unit 103 are provided in a separate manner, and the storage unit 107 is provided within the internal state estimation unit 102. In FIG. 9, the storage unit 107 and the internal state correction unit 103 are provided within the internal state estimation unit 102. In this embodiment, any of the configurations of FIG. 8 and FIG. 9 can be adopted.

The storage unit 107 stores the internal state vector x(t−h) of the battery 104 in the last sampling. The internal state estimation unit 102 updates the estimated value x(t−h) in the last sampling stored in the storage unit 107 through use of the measured value in the current sampling, to thereby calculate the estimated value x(t) in the current sampling. Note that, at least the estimated value x (t−h) in the last sampling only needs to be stored in the storage unit 107 as the estimated value of the internal state of the battery 104, but estimated values in processes of sampling previous to the last sampling (history data) (namely, x(t−h), x(t−2h), . . . , x(t−mh) (where m≥1)) may also be stored. In this case, an average of differences among those pieces of history data can also be used in order to estimate the estimated value x(t) in the current sampling.

Further, the storage unit 107 may also store the corrected value x'(t−h) of the internal state vector of the battery 104 in the last sampling. In this case, the internal state estimation unit 102 updates the corrected value x'(t−h) in the last sampling stored in the storage unit 107 through use of the measured value in the current sampling, to thereby calculate the estimated value x(t) in the current sampling. Note that, at least the corrected value x'(t−h) in the last sampling only needs to be stored in the storage unit 107 as the corrected value of the internal state of the battery 104, but corrected values in the processes of sampling previous to the last sampling (history data) (namely, x'(t−h), x'(t−2h), . . . , x'(t−mh) (where m≥1)) may also be stored.

Note that, in order to store the corrected value x'(t−h) in the storage unit 107, in the case of the configuration of FIG. 8, the internal state estimation unit 102 and the internal state correction unit 103 are provided in a separate manner, and hence after the estimated value of the internal state obtained by the internal state estimation unit 102 is corrected by the internal state correction unit 103, the corrected value is returned to the internal state estimation unit 102 to be stored in the storage unit 107. On the other hand, in the case of the configuration of FIG. 9, the internal state estimation unit 102 includes the storage unit 107 and the internal state correction unit 103, and hence the internal state estimation unit 102 calculates the estimated value of the internal state, corrects the estimated value through use of the internal state correction unit 103, and stores the corrected value in the storage unit 107.

Note that, in the following description, only what is different from the first embodiment described above is described, and a description of the same configuration and operation as those of the first embodiment is omitted. Thus, the description of the first embodiment is referred to for the same configuration and operation.

The internal state estimation unit 102 according to the fourth embodiment is described first. A description is first given of a case according to the fourth embodiment illustrated in FIG. 8 where the internal state estimation unit 102 and the internal state correction unit 103 are provided in a separate manner. A configuration example of the internal state estimation unit 102 is implemented with a Kalman filter based on the model of the battery 104. Namely, in the fourth embodiment, the internal state estimation unit 102 updates the estimated value x(t−h) of the internal state of the battery 104 in the last sampling or the corrected value x'(t−h) of the internal state of the battery 104 in the last sampling that is stored in the storage unit 107 (hereinafter collectively referred to as "stored vector x") by Kalman filtering through use of the measured value in the current sampling, and sets the resultant value as the estimated value x(t) of the internal state in the current sampling.

Figure 10:
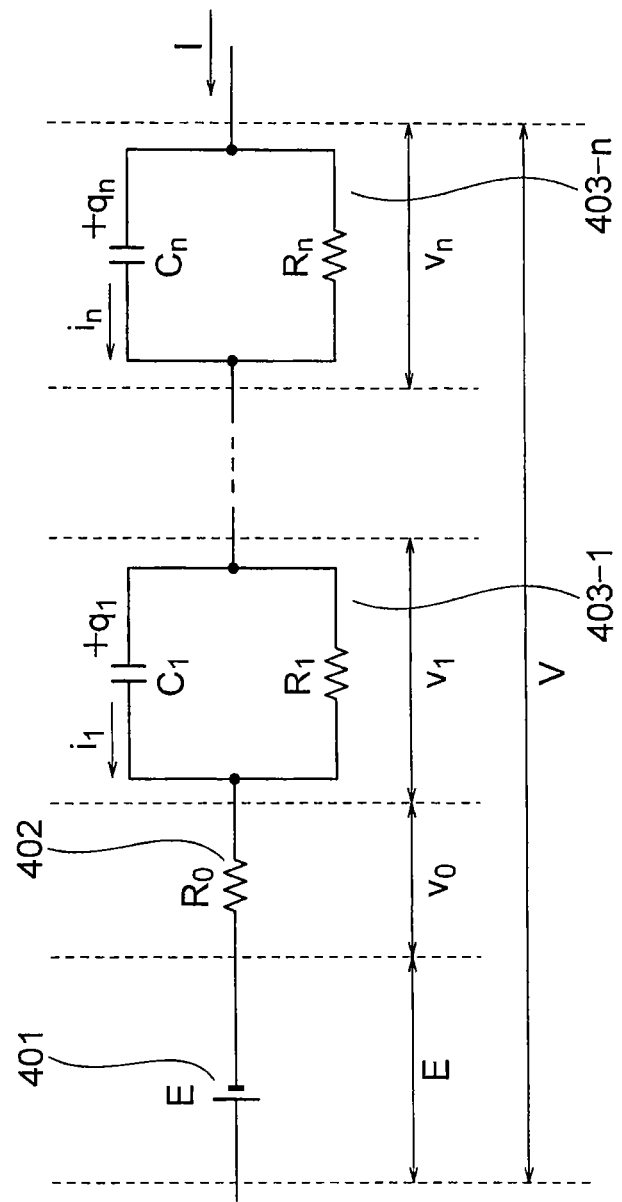
FIG. 10 is a diagram illustrating an equivalent circuit obtained by modeling a battery as an estimation target of the battery internal state estimation apparatus according to the fourth embodiment of the present invention.

For example, it is assumed that the battery 104 is modeled as illustrated in an equivalent circuit of FIG. 10. Namely, the battery 104 includes a voltage source E (reference numeral 401), a resistor $R_0$ (reference numeral 402), and n CR circuits (reference numerals 403-1, . . . , 403-n). In FIG. 10, the voltage source E [V] (reference numeral 401) is a function of an electrical quantity Q [C] stored in the battery 104 and an electrode temperature Te [K], and for example, Expression (9) resulting from the Nernst equation is used. In this expression, R represents the gas constant, F represents the Faraday constant, and γ+ and γ− represent preset constants, respectively.

$$E(Q, T_e) = \frac{RT}{F} \ln \frac{\gamma_+ + Q}{\gamma_- - Q} \tag{9}$$

Further, the resistors $R_0$ to $R_n$ are resistance values that depend on the temperature Te, and for example, for each resistor $R_i$ (i=0, . . . , n), Expression (10) resulting from the Arrhenius law is used. In this expression, $\eta_i$ and $\beta_i$ represent preset constants.

$$R_i(T_e) = \eta_i \exp\left[-\frac{\beta_i}{RT_e}\right] \tag{10}$$

Next, a differential equation of Expression (11) holds for each of the CR circuits.

$$\frac{dq_i}{dt} = -\frac{1}{C_i R_i(T_e)} q_i + I \tag{11}$$

Further, for the electrode temperature Te, considering the ohmic heating, chemical reaction heating, and Newton's law of cooling of the resistors $R_0$ to $R_n$, Expression (12) holds. In this expression, ν, ζ, and λ represent preset positive constants, and To represents the ambient temperature [K].

$$\frac{dT_e}{dt} = \nu \left( R_0(T_e) I^2 + \sum_{i=1}^{n} \frac{q_i^2}{C_i^2 R_i(T_e)} \right) + \zeta I - \lambda(T_e - T_o) \tag{12}$$

Moreover, for the electrical quantity Q, a differential equation of Expression (13) holds.

$$\frac{dQ}{dt} = I \tag{13}$$

The stored vector x and an input vector u are represented here by Expression (14) and Expression (15), respectively.

$$x^T = [Q T_e q_1 \cdots q_n] \tag{14}$$

$$u^T = [I T_o] \tag{15}$$

Further, a function f(x, u) is represented by Expression (16).

$$f(x, u) = \begin{bmatrix} I \\ \nu \left( R_0(T_e) I^2 + \sum_{i=1}^{n} \frac{q_i^2}{C_i^2 R_i(T_e)} \right) + \zeta I - \lambda(T_e - T_o) \\ -\frac{1}{C_1 R_1(T_e)} q_1 + I \\ \vdots \\ -\frac{1}{C_n R_n(T_e)} q_n + I \end{bmatrix} \tag{16}$$

In this case, the above-mentioned differential equations can be organized into Expression (17).

$$\frac{dx}{dt} = f(x, u) \tag{17}$$

When the inter-terminal voltage of the battery 104 is now represented by V [V], the inter-terminal voltage V can be written as Expression (18).

$$V = E(Q, T_e) + R_0(T_e)I + \sum_{i=1}^{n} \frac{1}{C_i} q_i \qquad (18)$$

This expression is written as Expression (19) using the stored vector x.

$$V = h(x, u) \qquad (19)$$

In this case, the state of charge S can be calculated through Expression (20).

$$S = \frac{100}{Q_{max}} Q \qquad (20)$$

Figure 11:
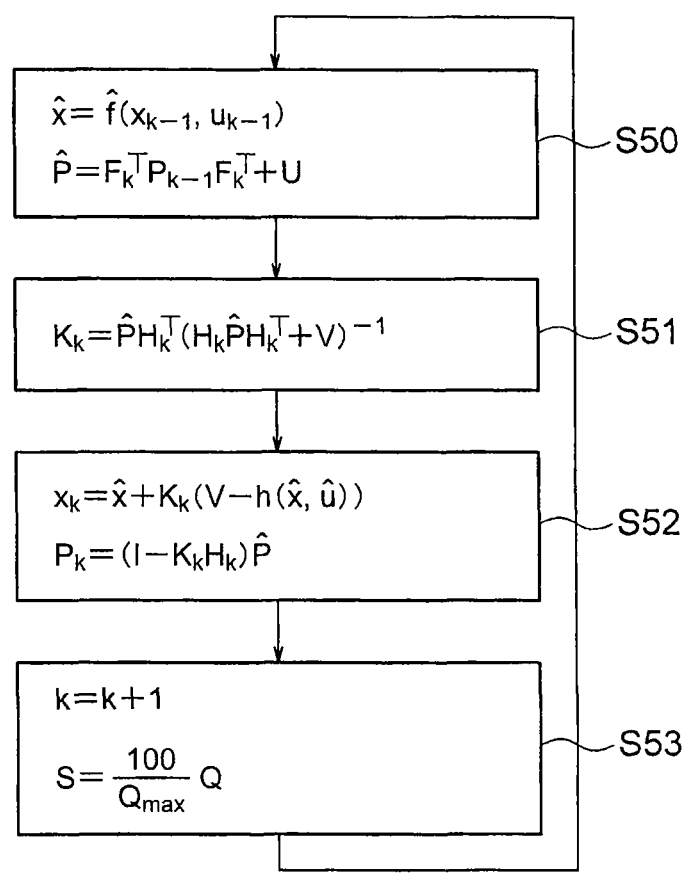
FIG. 11 is a flow chart illustrating a flow of processing performed by internal state estimation unit of the battery internal state estimation apparatus according to the fourth embodiment of the present invention.

Now, extended Kalman filtering for estimating the state of charge S with respect to the above-mentioned model of the battery 104 is configured as illustrated in a flow chart of FIG. 11. As illustrated in FIG. 11, first, in Step S50, when a stored vector and stored covariance matrix at a time t'=h(k−1) in the last sampling are respectively represented by $x_{k-1}$ and $P_{k-1}$, the differential equation (17) is solved at around the time t' to calculate a predicted state vector $\hat{x}$ at the time t=hk in the current sampling. In FIG. 11, this operation is expressed with a function $\hat{f}(\hat{x}=\hat{f}(x_{k-1}, u_{-1}))$. Next, when a partial derivative with respect to x of $\hat{f}$ is represented by a matrix F, a predicted covariance matrix $\hat{P}$ is calculated in accordance with Expression (21). In this expression, U represents a preset positive definite symmetric matrix.

$$\hat{P} = F_k^T P_{k-1} F_k^T + U \qquad (21)$$

Next, in Step S51, a Kalman gain $K_k$ is calculated in accordance with Expression (22). In this expression, V represents a preset positive definite symmetric matrix.

$$K_k = \hat{P} H_k^T (H_k \hat{P} H_k^T + V)^{-1} \qquad (22)$$

In subsequent Step S52, a stored vector $x_k$ and stored covariance matrix $P_k$ at the time t is calculated in accordance with Expression (23) and Expression (24). In this expression, $\hat{u}$ represents a predicted value of u at the time t, and for example, a value of u at the time t' may be used without change. In addition, $H_k$ represents a partial derivative matrix with respect to the stored vector x at the sampling interval h.

$$x_k = \hat{x} + K_k(V - h(\hat{x}, \hat{u})) \qquad (23)$$

$$P_k = (I - K_k H_k)\hat{P} \qquad (24)$$

In subsequent Step S53, the sampling time is incremented by one, and based on the electrical quantity Q included in the stored vector x, the state of charge S is calculated through Expression (20) to be output. This state of charge S is input to the internal state correction unit 103. The internal state correction unit 103 performs the same processing as that of the first embodiment illustrated in FIG. 3 to correct the estimated value of the internal state obtained by the internal state estimation unit 102 so that the estimated value is not contradictory at least to the conditions of the "qualitative properties of the battery 104" represented by (a) to (c). The estimated value of the internal state after the correction is input to the internal state estimation unit 102, and the internal state estimation unit 102 stores the corrected value in the storage unit 107.

Figure 12:
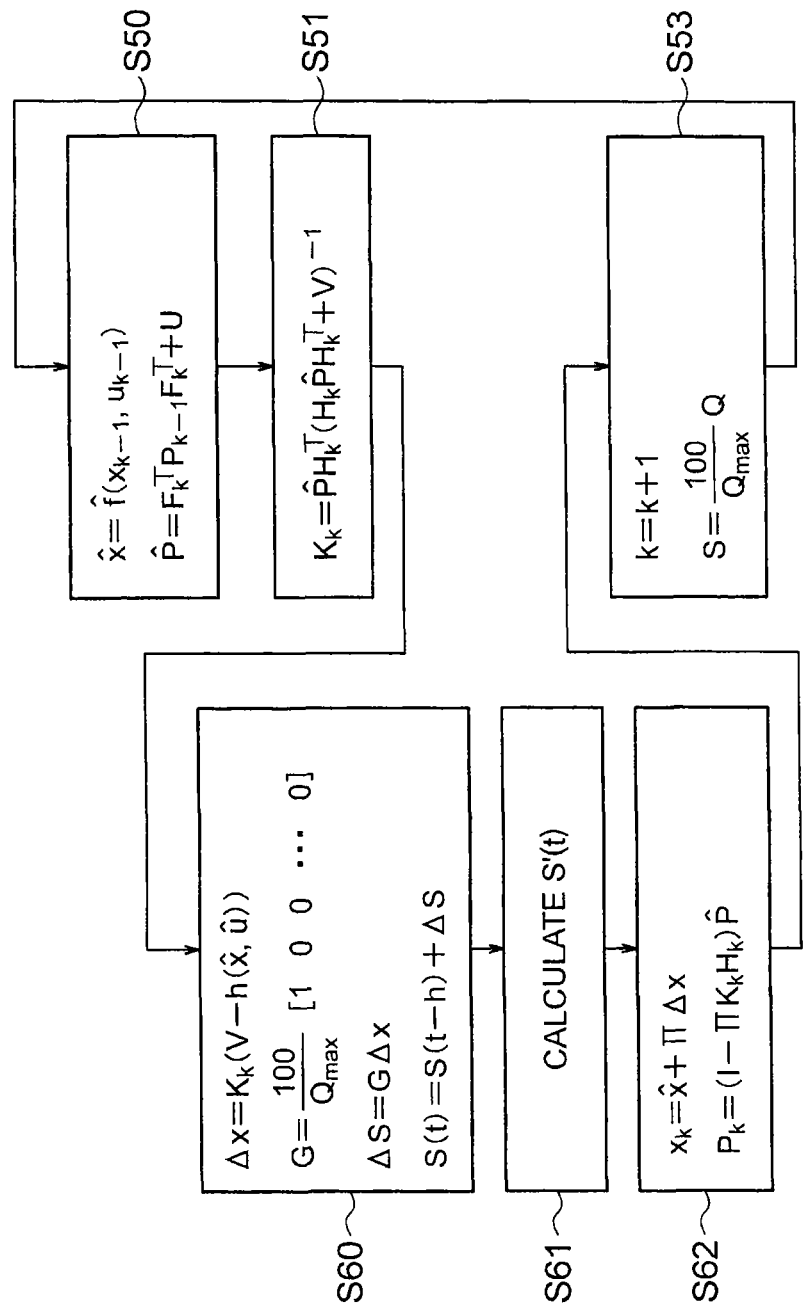
FIG. 12 is a flow chart illustrating a flow of processing performed by the internal state estimation unit and internal state correction unit of the battery internal state estimation apparatus according to the fourth embodiment of the present invention.

A description is next given of an example according to the fourth embodiment illustrated in FIG. 9 in which the internal state estimation unit 102 includes the internal state correction unit 103 in addition to the storage unit 107 to directly correct the estimated value. The configuration in this case is applied in such a manner as to replace Step S52 of FIG. 11 with other steps in the above-mentioned configuration. FIG. 12 illustrates a flow chart of the internal state estimation unit 102 to which the internal state correction unit 103 according to the fourth embodiment illustrated in FIG. 9 is applied.

The difference between FIG. 11 and FIG. 12 resides in that in FIG. 12, Steps S60 to S62 are provided in place of Step S52 of FIG. 11. Steps S50, S51, and S53 are the same as those of FIG. 11, and hence a description thereof is omitted here.

As illustrated in FIG. 12, in Steps S50 and S51, the internal state estimation unit 102 first performs the same processing as that of Steps S50 and S51 of FIG. 11. In Step S60, the internal state estimation unit 102 next calculates ΔS and S(t) in accordance with Expression (25).

$$\Delta x = K_k(V - h(\hat{x}, \hat{u})) \qquad (25)$$
$$G = \frac{100}{Q_{max}}[1 \ 0 \ 0 \ \ldots \ 0]$$
$$\Delta S = G \Delta x$$
$$S(t) = S(t - h) + \Delta S$$

In subsequent Step S61, the internal state correction unit 103 uses those values to calculate S'(t) in accordance with the flow chart illustrated in FIG. 3, as in the first embodiment described above. The processing performed by the internal state correction unit 103 is the same as that of the first embodiment, and hence a description thereof is omitted here.

In Step S62, the internal state estimation unit 102 next calculates b and Π through Expression (26), and uses b and Π to calculate the stored vector $x_k$ and the stored covariance matrix $P_k$ in accordance with Expression (27), and advances the processing to Step S53. In Step S53, the internal state estimation unit 102 performs the same processing as that of Step S53 of FIG. 11.

$$b = \frac{S'(t) - S(t)}{\Delta S} \qquad (26)$$
$$\Pi = I - \frac{G^T(GG^T)^{-1}G}{1 - b}$$

$$x_k = \hat{x} + \Pi \Delta x \qquad (27)$$
$$P_k = (I - \Pi K_k H_k)\hat{P}$$

With the internal state correction unit 103 according to the fourth embodiment, in the case of the configuration in which the internal state estimation unit 102 includes the storage unit 107 and a desired internal state is estimated by updating storage data stored in the storage unit 107, it is possible to configure the battery internal state estimation apparatus capable of directly correcting the storage data and achieving the same effect as that of the first embodiment described above.

Note that, in the above description of the fourth embodiment, the relationships between the current flowing through the battery 104 and the state of charge are taken as an example of the "qualitative properties of the battery 104". However, in the fourth embodiment, the "qualitative properties of the battery 104" are not limited thereto. A similar internal state correction unit 103 can be configured also with regard to a relationship between an arbitrary internal state of the battery 104 and an arbitrary measured value of the battery 104 or a relationship between arbitrary two internal states of the battery 104. The same can be said for the first to third embodiments described above.

As described above, the battery internal state estimation apparatus 101 according to the fourth embodiment includes: the internal state estimation unit 102, which inputs at least one of the measured values obtained by the battery measurement unit 105 at the preset sampling intervals, that is, the current flowing through the battery 104, the inter-terminal voltage, the battery temperature, and the ambient air temperature, for estimating, based on the input measured value, at least one of the state of charge of the battery 104, the internal temperature of the battery 104, the capacity of the battery 104, and the internal resistance of the battery 104 as the internal state of the battery 104; and the internal state correction unit 103 for correcting the estimated value of the internal state obtained by the internal state estimation unit 102 so that the estimated value is not contradictory at least to the conditions of the "qualitative properties of the battery 104". Accordingly, even when the estimated value of the internal state of the battery 104 obtained by the internal state estimation unit 102 does not satisfy the conditions of the "qualitative properties of the battery 104", the internal state correction unit 103 corrects the estimated value so that the estimated value is not contradictory at least to those conditions, and hence it is possible to estimate the internal state of the battery 104 so that the estimated internal state is not contradictory to the "qualitative properties of the battery 104" assumed by the host system.

Further, in the fourth embodiment, the internal state estimation unit 102 includes the storage unit for storing the estimated value of the internal state of the battery 104, and updates the stored estimated value of the internal state through the Kalman filtering, to thereby estimate the internal state of the battery 104. In this way, also in the case where the internal state estimation unit 102 has a memory of the internal state of the battery 104 and estimates the internal state by updating this memory, similarly to the first embodiment described above, it is possible to estimate the internal state of the battery 104 so that the estimated internal state is not contradictory to the "qualitative properties of the battery 104" assumed by the host system.

Further, in the fourth embodiment, the internal state estimation unit 102 inputs the measured values of the inter-terminal voltage of the battery 104 and the current flowing through the battery 104 and estimates the state of charge of the battery 104 based on the input values. Accordingly, in the estimation of the state of charge, as in the first embodiment described above, it is possible to estimate the internal state of the battery 104 so that the estimated internal state is not contradictory to the "qualitative properties of the battery 104" assumed by the host system.

Note that, in this embodiment, when the internal state estimation unit 102 has the equivalent circuit model of the battery 104 and estimates the state of charge and the battery internal resistance included in the equivalent circuit model from the current flowing through the battery 104 and the inter-terminal voltage of the battery 104, the internal state correction unit 103 sets the state of charge and the battery internal resistance as the internal state vector to calculate the corrected value of the internal state vector.

Further, in this embodiment, when the battery internal state estimation unit 102 has another equivalent circuit model of the battery 104, a parameter of the equivalent circuit model depends on the electrode temperature, and the battery internal state estimation unit 102 estimates the state of charge and the battery temperature from the current flowing through the battery 104 and the inter-terminal voltage of the battery 104, and the electrode temperature or ambient air temperature of the battery 104, the internal state correction unit 103 sets the state of charge and the battery temperature as the internal state vector to calculate the estimated value of the internal state vector.

REFERENCE SIGNS LIST

101 battery internal state estimation apparatus, 102 internal state estimation unit, 103 internal state correction unit, 104 battery, 105 battery measurement unit, 106 output unit, 107 storage unit, 201 water tank, 202 water, 203 pipe, 401 voltage source E, 402 resistor $R_0$, 403-1, 403-$n$ CR circuit

The invention claimed is:

1. A battery internal state estimation apparatus for estimating an internal state of a battery for use with a host system configured to use the battery when a qualitative property of the battery is met, comprising:
   circuitry configured to
   estimate a state of charge of the battery, or in addition to the state of charge, at least one of an internal temperature of the battery and an internal resistance of the battery, based on a current value I(t) of current flowing through the battery at a sampling time t and an inter-terminal voltage V(t) of the battery, which are measured at preset sampling intervals h, and output the estimated state of charge of the battery, or the estimated at least one of the internal temperature of the battery and the internal resistance of the battery in addition to the state of charge, as an internal state x(t) of the battery;
   correct a value of at least one of elements of the internal state x(t) obtained by the circuitry; and
   output the corrected values as a corrected value x'(t) of the internal state, thereby outputting a corrected estimate of the state of charge of the battery to permit a determination of whether the qualitative property of the battery is met,
   wherein the circuitry is configured to:
   calculate a difference Δx, which is a difference between the internal state x(t) obtained by the circuitry and a corrected value x'(t−h) of the internal state in last sampling;
   determine whether or not an absolute value |ΔS| of an element ΔS representing the state of charge among elements of the difference Δx is equal to or larger than an absolute value $|\Delta S_{I(t)}|$ of a change $\Delta S_{I(t)}$ in state of charge obtained based on the current value I(t);
   set, when the absolute value |ΔS| is equal to or larger than the absolute value $|\Delta S_{I(t)}|$, a value obtained by adding the corrected value x'(t−h) of the internal state in the last sampling to a value obtained by scaling the difference Δx so that the element ΔS representing the state of charge becomes the same as the change $\Delta S_{I(t)}$ in state of charge, as the corrected value x'(t) of the internal state; and
   when the absolute value |ΔS| is smaller than the absolute value $|\Delta S_{I(t)}|$:
   set, when the current value I(t) and the element ΔS representing the state of charge have the same sign, the internal state x(t) obtained by the circuitry as the corrected value x'(t) of the internal state; and set, when the current value I(t) and the element ΔS representing the state of charge have different signs, the corrected value x'(t–h) in the last sampling as the corrected value x'(t) of the internal state without change.

2. The battery internal state estimation apparatus according to claim 1, wherein the circuitry is configured to use the current value I(t) and the inter-terminal voltage V(t) together with the internal state in the last sampling or the corrected value of the internal state in the last sampling obtained by the circuitry to calculate the internal state.

3. The battery internal state estimation apparatus according to claim 1, wherein when the has circuitry has an equivalent circuit model of the battery and estimates the state of charge from the current value and the inter-terminal voltage based on the equivalent circuit model, the circuitry is configured to set the state of charge as the internal state to calculate the corrected value of the internal state.

4. The battery internal state estimation apparatus according to claim 3, wherein when the circuitry has an equivalent circuit model of the battery and estimates the state of charge from the current value and the inter-terminal voltage based on the equivalent circuit model, the circuitry is configured to set the state of charge as the internal state to calculate the corrected value of the internal state.

5. The battery internal state estimation apparatus according to claim 1, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

6. The battery internal state estimation apparatus according to claim 2, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

7. The battery internal state estimation apparatus according to claim 3, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

8. The battery internal state estimation apparatus according to claim 4, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

9. The battery internal state estimation apparatus according to claim 1, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

10. The battery internal state estimation apparatus according to claim 2, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

11. The battery internal state estimation apparatus according to claim 3, wherein when the circuitry has an equivalent circuit model of the battery, a parameter of the equivalent circuit model depends on an internal temperature of the battery, and the circuitry the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

12. The battery internal state estimation apparatus according to claim 4, wherein when the circuitry has an equivalent circuit model of the battery, a parameter of the equivalent circuit model depends on an internal temperature of the battery, and the circuitry the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

13. The battery internal state estimation apparatus according to claim 1, wherein the battery comprises a lithium ion secondary battery.

14. A battery internal state estimation apparatus for estimating an internal state of a battery for use with a host system configured to use the battery when a qualitative property of the battery is met, comprising:

circuitry configured to estimate a state of charge of the battery based on a current value of current flowing through the battery and an inter-terminal voltage of the battery, which are measured at preset sampling intervals, and outputting the estimated state of charge as an internal state of the battery;

correct the state of charge obtained by the circuitry; and output the corrected state of charge as a corrected value of the internal state of the battery, thereby outputting a corrected estimate of the state of charge of the battery to permit a determination of whether the qualitative property of the battery is met, wherein the circuitry is configured to:

calculate a difference between the state of charge obtained by the circuitry and a corrected value of the state of charge in last sampling; and determine whether or not an absolute value of the difference is equal to or larger than an absolute value of a change in state of charge obtained based on the current value, and set, when the absolute value of the difference is equal to or larger than the absolute value of the change in state of charge, a value obtained by adding the corrected value of the state of charge in the last sampling to a value of the change in state of charge obtained based on the current value, as the corrected value of the state of charge.

15. The battery internal state estimation apparatus according to claim 14, wherein the circuitry is configured to use the current value I(t) and the inter-terminal voltage V(t) together with the internal state in the last sampling or the corrected value of the internal state in the last sampling obtained to calculate the internal state.

16. The battery internal state estimation apparatus according to claim 14, wherein when the circuitry has an equivalent circuit model of the battery and estimates the state of charge from the current value and the inter-terminal voltage based on the equivalent circuit model, the circuitry is configured to set the state of charge as the internal state to calculate the corrected value of the internal state.

17. The battery internal state estimation apparatus according to claim 15, wherein when the circuitry has an equivalent circuit model of the battery and estimates the state of charge from the current value and the inter-terminal voltage based on the equivalent circuit model, the circuitry is configured to set the state of charge as the internal state to calculate the corrected value of the internal state.

18. The battery internal state estimation apparatus according to claim 14, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

19. The battery internal state estimation apparatus according to claim 15, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

20. The battery internal state estimation apparatus according to claim 16, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

21. The battery internal state estimation apparatus according to claim 17, wherein when the circuitry has an equivalent circuit model of the battery and estimates the state of charge and a battery internal resistance included in the equivalent circuit model from the current value and the inter-terminal voltage, the circuitry is configured to set the state of charge and the battery internal resistance as the internal state to calculate the corrected value of the internal state.

22. The battery internal state estimation apparatus according to claim 14, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of battery temperature and the ambient air temperature, the circuitry is configured to set the state of charge and the internal temperature of the battery as the internal state to calculate the estimated value of the internal state.

23. The battery internal state estimation apparatus according to claim 15, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

24. The battery internal state estimation apparatus according to claim 16, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

25. The battery internal state estimation apparatus according to claim 17, wherein when the circuitry has an equivalent circuit model of the battery, a parameter of the equivalent circuit model depends on an internal temperature of the battery, and the circuitry estimates the state of charge and the internal temperature of the battery based on the current value and the inter-terminal voltage together with any one of a battery temperature and the ambient air temperature, the circuitry is configured to set the state of charge and the internal temperature of the battery as the internal state to calculate the estimated value of the internal state.

26. The battery internal state estimation apparatus according to claim 14, wherein the battery comprises a lithium ion secondary battery.

27. A battery internal state estimation method for estimating an internal state of a battery for use with a host system configured to use the battery when a qualitative property of the battery is met, comprising:
  estimating, using circuitry, a state of charge of the battery based on a current value of current flowing through the battery and an inter-terminal voltage of the battery, which are measured at preset sampling intervals, and outputting the estimated state of charge as an internal state of the battery;
  correcting, using the circuitry, the state of charge obtained by the circuitry;
  outputting, using the circuitry, the corrected state of charge as a corrected value of the internal state of the battery, thereby outputting a corrected estimate of the state of charge of the battery; and
  determining, in accordance with the corrected state, whether the qualitative property of the battery is met,
  wherein said correcting comprises:
    calculating a difference between the state of charge obtained by the circuitry and a corrected value of the state of charge in last sampling; and
    determining whether or not an absolute value of the difference is equal to or larger than an absolute value of a change in state of charge obtained based on the current value, and setting, when the absolute value of the difference is equal to or larger than the absolute value of the change in state of charge, a value obtained by adding the corrected value of the state of charge in the last sampling to a value of the change in state of charge obtained based on the current value, as the corrected value of the state of charge.

* * * * *